United States Patent
Song et al.

(10) Patent No.: US 8,785,902 B2
(45) Date of Patent: Jul. 22, 2014

(54) RESISTIVE MEMORY DEVICE AND METHOD FOR FABRICATING THE SAME

(71) Applicant: SK hynix Inc., Gyeonggi-do (KR)

(72) Inventors: Seok-Pyo Song, Gyeonggi-do (KR); Yu-Jin Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/947,821

(22) Filed: Jul. 22, 2013

(65) Prior Publication Data

US 2013/0313507 A1 Nov. 28, 2013

Related U.S. Application Data

(62) Division of application No. 12/979,922, filed on Dec. 28, 2010, now Pat. No. 8,519,374.

(30) Foreign Application Priority Data

Jan. 21, 2010 (KR) .................. 10-2010-0005549

(51) Int. Cl.
  *H01L 45/00* (2006.01)
  *H01L 29/41* (2006.01)

(52) U.S. Cl.
  CPC .......... *H01L 45/1273* (2013.01); *H01L 45/124* (2013.01)
  USPC ..... 257/4; 257/2; 257/3; 257/5; 257/E45.002; 257/E29.112

(58) Field of Classification Search
  CPC ....... H01L 45/04; H01L 45/06; H01L 45/124; H01L 45/1273; H01L 29/02; H01L 29/40; H01L 2029/41
  USPC .......................... 365/148; 257/2–5, E45.002, 257/E29.002–E29.006, E29.111–E29.113
  See application file for complete search history.

(56) References Cited

U.S. PATENT DOCUMENTS

| | | | |
|---|---|---|---|
| 7,400,006 B1 * | 7/2008 | Rinerson et al. | 257/295 |
| 8,013,711 B2 * | 9/2011 | Wei et al. | 338/20 |
| 2009/0230378 A1 * | 9/2009 | Ryoo et al. | 257/4 |
| 2009/0275198 A1 * | 11/2009 | Kamepalli et al. | 438/659 |
| 2010/0032641 A1 * | 2/2010 | Mikawa et al. | 257/3 |
| 2010/0051896 A1 * | 3/2010 | Park et al. | 257/4 |
| 2011/0147694 A1 * | 6/2011 | Song et al. | 257/3 |

* cited by examiner

*Primary Examiner* — Allison P Bernstein
(74) *Attorney, Agent, or Firm* — IP & T Group LLP

(57) ABSTRACT

A resistive memory device includes a lower electrode formed on a substrate, a resistive layer formed on the lower electrode, and an upper electrode on the resistive layer, wherein a lower portion of the upper electrode is narrower than an upper portion of the upper electrode.

10 Claims, 6 Drawing Sheets

RESISTIVE MEMORY DEVICE AND METHOD FOR FABRICATING THE SAME

CROSS-REFERENCE TO RELATED APPLICATIONS

This application is a division of U.S. patent application Ser. No. 12/979,922 filed on Dec. 28, 2010, which claims priority of Korean Patent Application No. 10-2010-0005549, filed on Jan. 21, 2010. The disclosure of each of the foregoing application is incorporated herein by reference in its entirety.

BACKGROUND OF THE INVENTION

Exemplary embodiments of the present invention relate to a semiconductor device fabrication technology, and more particularly, to a resistive memory device using a resistance change in detecting data, such as a nonvolatile resistive random access memory (ReRAM) and a method for fabricating the same.

Next generation memory devices which can replace a dynamic random access memory (DRAM) and a flash memory are being developed. One of such next generation memory devices is a resistive memory device using a resistive layer. Specifically, a resistive memory device uses a material whose resistance rapidly changes according to a bias applied thereto and thus can switch between at least two different resistance states.

According to an example, a resistive memory device includes a resistive element and a selection element. The resistive element includes a lower electrode, a resistive layer, and an upper electrode, which are sequentially formed on a substrate. A filament current path is formed or removed within the resistive layer of the resistive element according to biases applied to the upper electrode and the lower electrode, and data is stored according to a resistance state which depends on the formation and removal of the filament current path.

Therefore, the resistive memory device may have a large sensing current and may be sensitive to a resistance. Here, as the effective area of the resistive element becomes larger, a characteristic of the resistive element is degraded. Thus, methods for reducing the effective area of the resistive element are useful.

Reducing an area of a resistive element is difficult. Further, in reducing the area of the resistive element, the area of the selection element may also be reduced and thus the resistance of the selection element may be increased. Therefore, an electric field and a current required upon a switching operation may not be appropriately supplied to the resistive element.

SUMMARY OF THE INVENTION

An embodiment of the present invention is directed to a resistive memory device including an upper electrode a lower portion of which is narrower than an upper portion thereof.

Another embodiment of the present invention is directed to a resistive memory device includes: a lower electrode formed on a substrate; a resistive layer formed on the lower electrode; and an upper electrode formed on the resistive layer, wherein a lower portion of the upper electrode is narrower than an upper portion of the upper electrode.

In accordance with an embodiment of the present invention, a method for fabricating a resistive memory device includes: forming a lower electrode on a substrate; forming a sacrificial layer on the lower electrode; etching the sacrificial layer to form a trench having a lower portion narrower than an upper portion of the trench; forming a resistive layer in the trench; and forming an upper electrode by burying a conductive layer within the trench and over the resistive layer formed in the trench.

DESCRIPTION OF SPECIFIC EMBODIMENTS

Figure 1A:
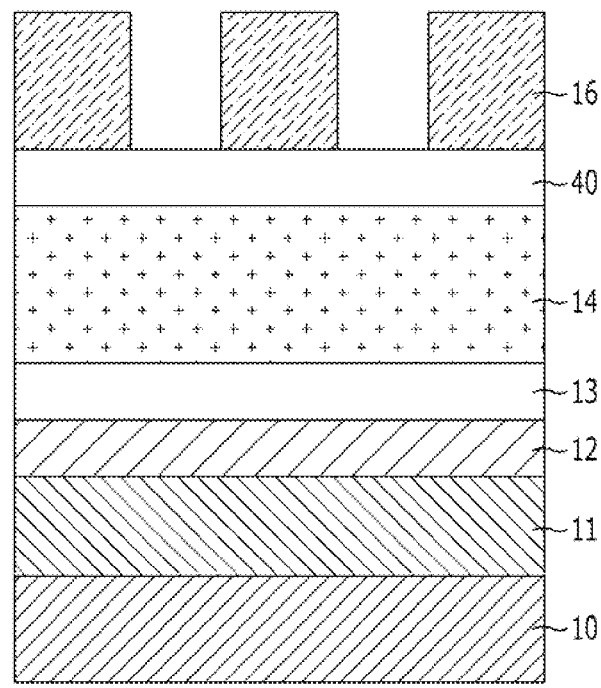
FIGS. 1A to 1F are cross-sectional views illustrating a method for fabricating a resistive memory device in accordance with a first embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to dearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIGS. 1A to 1F are cross-sectional views illustrating a method for fabricating a resistive memory device in accordance with a first embodiment of the present invention.

Referring to FIG. 1A, a selection line 11 is formed on a substrate 10. The selection line 11 may be formed of a diffusion barrier material selected from copper, aluminum, tungsten, ruthenium, platinum, gold, titanium nitride, and tantalum nitride. For example, the selection line 11 may be formed of copper or tungsten. In addition, the selection line 11 may be formed by forming a conductive layer and patterning the conductive layer, or may be formed by a damascene process.

A lower electrode 12 is formed on the selection line 11. The lower electrode 12 may be formed of a diffusion barrier material to selected from nickel, platinum, gold, silver, copper, tungsten, titanium nitride, tantalum nitride, aluminum, and ruthenium.

A sacrificial layer is formed on the lower electrode 12. The sacrificial layer is formed to ensure a region in which a resistive layer and an upper electrode are to be formed in a subsequent process. The sacrificial layer may be formed by stacking a desired material layer.

In the prefer embodiment, a first hard mask layer 13 is formed on the lower electrode 12, and an insulation layer 14 is formed on the first hard mask layer 13. In this manner, the sacrificial layer including the first hard mask layer 13 and the insulation layer 14 may be formed. The first hard mask layer 13 may include silicon nitride or silicon oxynitride which has excellent insulation characteristic.

A second hard mask layer 40 is formed on the sacrificial layer 13 and 14, and a photoresist pattern 16 is formed on the second hard mask layer 40. The photoresist pattern 16 is formed to have an opening which opens a region in which a resistive element pattern is to be formed, in order to form a pattern of the resistive element.

Figure 1B:
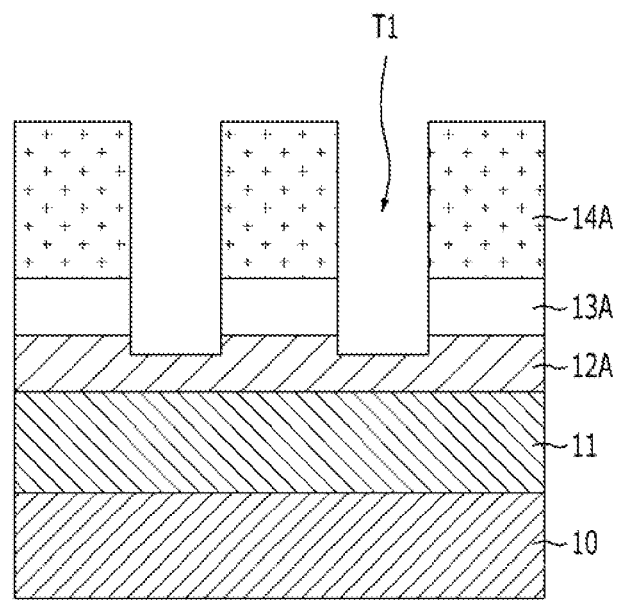

Referring to FIG. 1B, the second hard mask layer 40 is etched using the photoresist pattern 16 as an etch barrier, and the sacrificial layer 13 and 14 are etched using the etched second hard mask layer 40 as an etch barrier. Through such an etching process, a first trench T1 for a resistive element pattern is formed.

At this time, the etching process is performed to expose the surface of the lower electrode 12 under the first trench Ti. An overetching process may be performed in order to ensure a sufficient contact area between a resistive layer to be formed by a subsequent process and the lower electrode 12. That is, when forming the first trench T1, the lower electrode 12 may be etched by a desired depth.

In FIG. 1B, a reference numeral "12A" represents the lower electrode the surface of which is partially etched by the overetching process. In addition, a reference numeral "14A" represents the insulation layer etched in the process of forming the first trench T1, and a reference numeral "13A" represents the etched first hard mask layer.

The remaining photoresist pattern 16 and second hard mask layer 40 are removed.

Figure 1C:
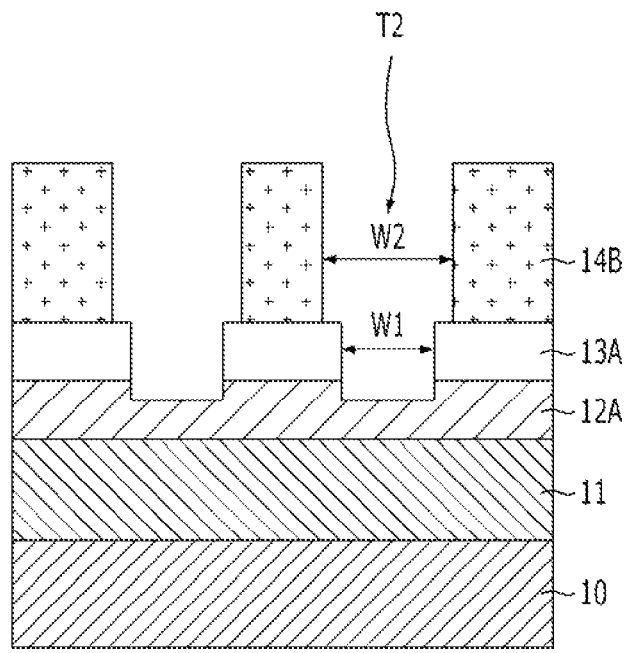
Figure 1D:
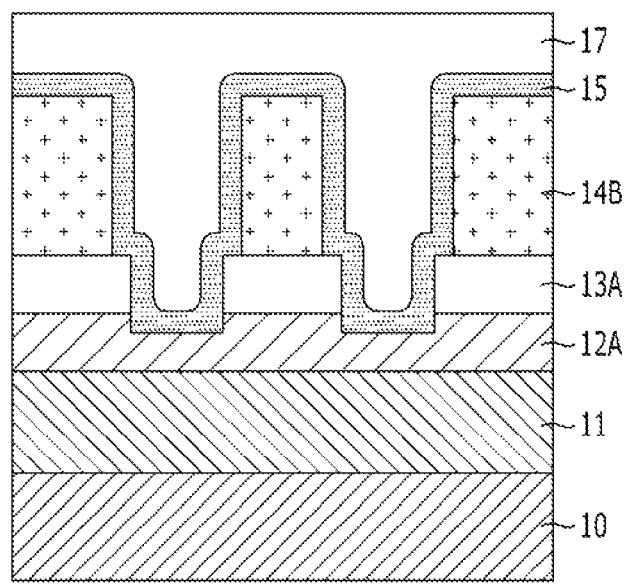

Referred to FIG. 1C, the insulation layer 14A exposed at the inner wall of the first trench T1 is recessed by a desired thickness to increase the upper width of the first trench Ti, The process of recessing the insulation layer 14A may be performed under a condition where an etch selectivity between the insulation layer 14A and the first hard mask layer 13A is high. That is, the upper width of the first trench T1 may be increased by selectively etching the insulation layer 14A by a desired thickness while the first hard mask layer 13A remains (that is, the etching rate of the insulation layer 14A is higher than that of the first hard mask layer 13A).

For example, the insulation layer 14A may be recessed by a to dry etching process or a wet etching process. According to an example, the insulation layer 14A may be recessed by an isotropic etching process.

Consequently, a second trench T2 is formed to have a lower portion narrower than an upper portion thereof (W1<W2). That is, the second trench T2 is formed to have a stepped sidewall, a width of which is narrower at the lower portion thereof. In FIG. 1C, a reference numeral "14B" represents the recessed insulation layer.

Referring to FIG. 10, a resistive layer 15 is formed over a profile of the second trench T2. The resistive layer 15 is formed of any reasonably suitable material that causes a resistance change. In the prefer embodiment, the resistive layer 15 comprises phase change materials for a PCRAM or resistive variable materials for an ReRAM. For example, the resistive layer 15 may include a chalcogenide glass, a binary transition metal oxide, or a perovskite oxide.

A conductive layer 17 for an upper electrode is formed over a resulting structure in which the resistive layer 15 has been formed. According to an example, the conductive layer 17 for the upper electrode may include a diffusion barrier material selected from nickel, platinum, gold, silver, copper, tungsten, titanium nitride, tantalum nitride, aluminum, and ruthenium.

The resistive layer 15 and the conductive layer 17 for the upper electrode may be formed by a process having excellent step coverage. For example, the resistive layer 15 and the conductive layer 17 for the upper electrode may be formed by a chemical vapor deposition (CVD) process or an atomic layer deposition (ALD) process.

Figure 1E:
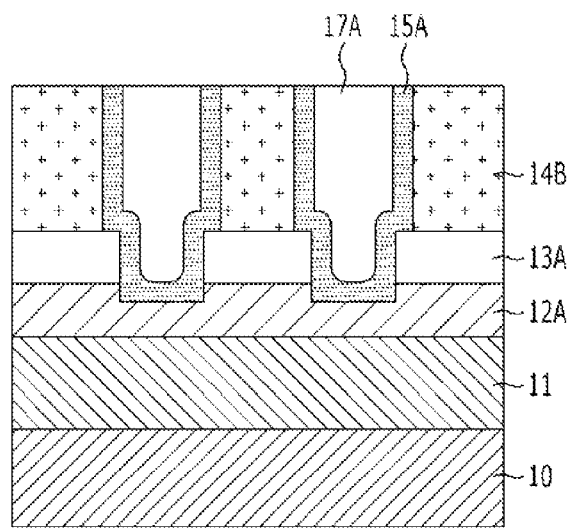

Referring to FIG. 1E, an upper electrode 17A is formed by performing a planarization process until the surface of the insulation layer 14B is exposed. In FIG. 1E, a reference numeral "15A" represents the resistive layer etched during the planarization process. The upper electrode 17A may be formed in a pillar shape in which a lower portion is narrower than an upper portion. In particular, the upper electrode 17A may be formed to have a stepped sidewall, a width of which is narrower at the lower portion thereof.

In addition, the sidewall and the lower portion of the upper electrode 17A are surrounded by the resistive layer 15A. Therefore, the resistive layer 15A is disposed between the upper electrode 17A and the lower electrode 12A. In this manner, the resistive element including the lower electrode 12A, the resistive layer 15A, and the upper electrode 17A, a lower portion of which is narrower than an upper portion thereof, is formed.

Figure 1F:
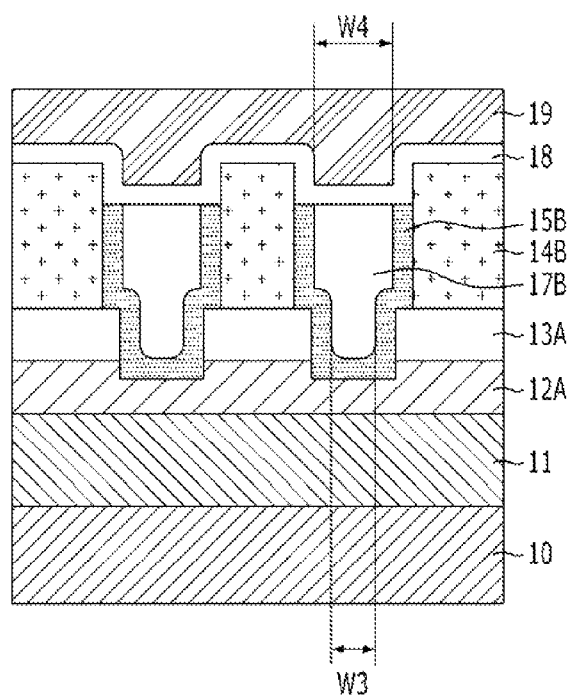

Referring to FIG. 1F, the upper electrode 17A and the resistive layer 15A buried within the trench are partially recessed by a desired depth. In FIG. 1F, a reference numeral "17B" represents the upper electrode etched by the recess process, and a reference numeral "15B" represents the etched resistive layer.

Through the recess process, the upper electrode 17B and the resistive layer 155 are buried within the sacrificial layer 13A and 145 to on the lower electrode 12A. At this time, the top surfaces of the upper electrode 175 and the resistive layer 155 are lower than the top surface of the sacrificial layer 14B.

A selection element 18 is formed on a resulting structure in which the upper electrode 17B and the resistive layer 15B are partially recessed by a desired depth. The selection element 18 may include a polycrystalline silicon diode, an oxide diode, a thin tunnel oxide layer, or a thin tunnel nitride layer.

A selection electrode 19 is formed on the selection element 18.

The selection electrode 19 may be formed of a diffusion barrier material selected from nickel, platinum, gold, silver, copper, tungsten, titanium nitride, tantalum nitride, aluminum, and ruthenium.

In accordance with the embodiment of the present invention set forth above, the upper electrode 17B, a lower portion of which is narrower than an upper portion thereof, can be formed. By forming the upper electrode 17B, a lower portion of which becomes narrower in width, the effective area W3 of the resistive element is further reduced, thereby obtaining appropriate characteristics of the resistive memory device. In addition, by forming the upper electrode 17B, an upper portion of which becomes wider in width, the contact area between the selection element 18 and the upper electrode 176 of the resistive element (that is, the effective area W4 of the selection element 18), can be further increased. Therefore, since the resistance of the selection element 18 for turning on a connection to the resistive element is reduced, an electric field and a current required in the operation of switching the resistive element can be appropriately supplied.

Figure 2A:
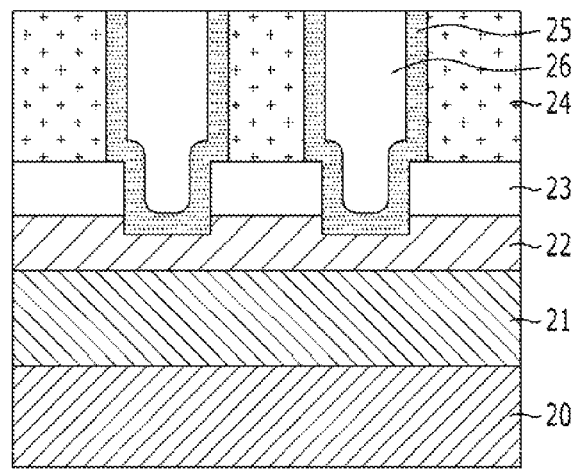
FIGS. 2A and 2B are cross-sectional views illustrating a method for fabricating a resistive memory device in accordance with a second embodiment of the present invention.

FIGS. 2A and 26 are cross-sectional views illustrating a method for fabricating a resistive memory device in accordance with a second embodiment of the present invention.

Referring to FIG. 2A, a selection line 21 is formed on a substrate 20, and a lower electrode 22 is formed on the selection line 21. Sacrificial layers 23 and 24 are formed on the lower electrode 22. The sacrificial layers 23 and 24 are etched to form a trench, a lower portion of which is narrower than an upper portion thereof. A resistive layer 25 is formed on a resulting structure in which the trench has been formed, A conductive layer for an upper electrode is formed on a resulting structure in which the resistive layer 25 has been formed.

An upper electrode 26 is formed by performing a planarization process until the surface of the sacrificial layer 24 is exposed. The upper electrode 26 and the resistive layer 25 are buried within the sacrificial layers 23 and 24 and buried over the lower electrode 22. At this time, the top surfaces of the upper electrode 26 and the resistive layer 25 are equal in height to the top surface of the sacrificial layer 24.

Since the preceding processes are substantially identical to the first embodiment described with reference to FIGS. 1A to 1E, detailed to description thereof will be omitted.

Figure 2B:
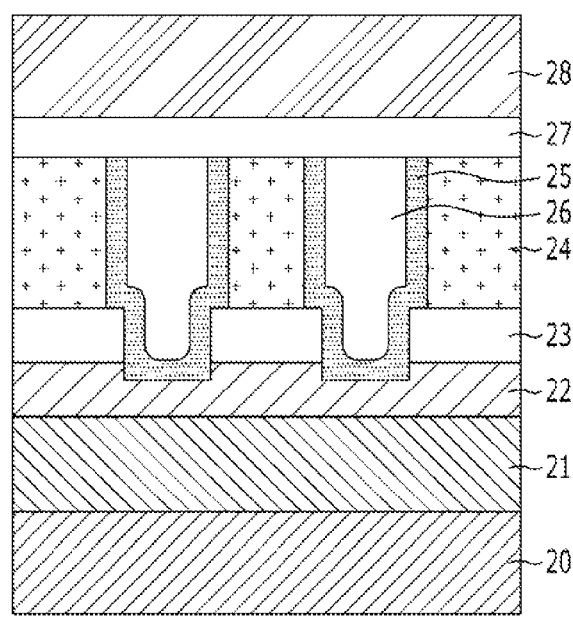

Referring to FIG. 2B, a selection element 27 is formed on a resulting structure in which the planarization process has been performed. A selection electrode 28 is formed on the selection element 27.

Figure 3A:
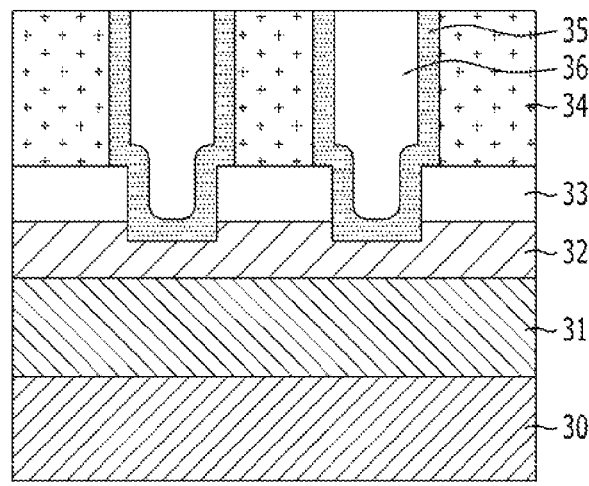
FIGS. 3A to 3C are cross-sectional views illustrating a method for fabricating a resistive memory device in accordance with a third embodiment of the present invention.
Figure 3B:
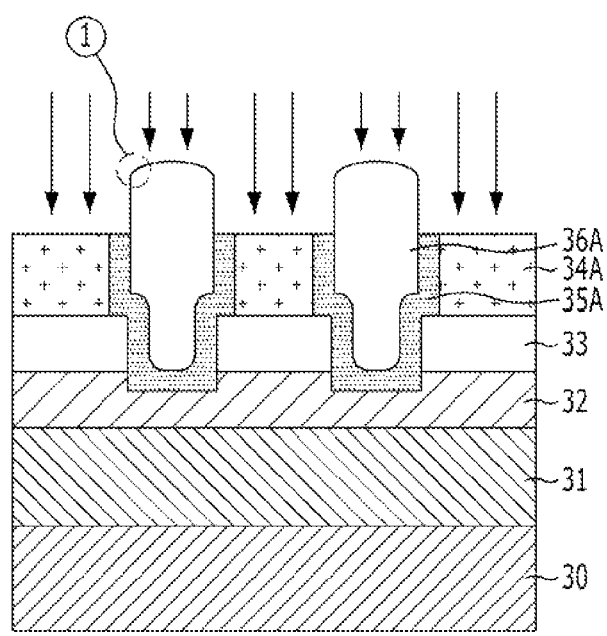
Figure 3C:
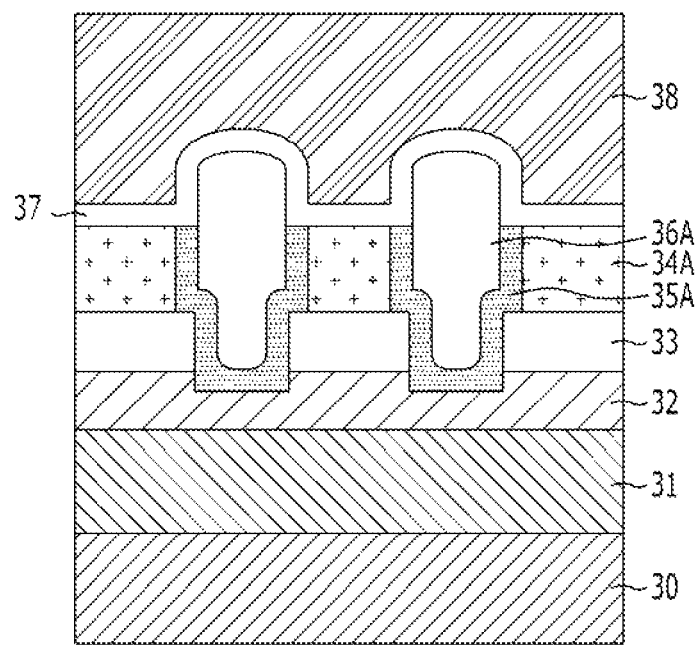

FIGS. 3A to 3C are cross-sectional views illustrating a method for fabricating a resistive memory device in accordance with a third embodiment of the present invention.

Referring to FIG. 3A, a selection line 31 is formed on a substrate 30, and a lower electrode 32 is formed on the selection line 31. Sacrificial layers 33 and 34 are formed on the lower electrode 32. The sacrificial layers 33 and 34 are etched to form a trench, a lower portion of which is narrower than an upper portion thereof. A resistive layer 35 is formed on a resulting structure in which the trench has been formed, A conductive layer for an upper electrode is formed on a resulting structure in which the resistive layer 35 has been formed. An upper electrode 36 is formed by performing a planarization process until the surface of the sacrificial layer 34 is exposed. In this manner, the upper electrode 36 is formed. At this time, the sidewall and bottom surface of the upper electrode 36 are surrounded by the resistive layer 35.

Since the preceding processes are substantially identical to the first embodiment described with reference to FIGS. 1A to 1E, detailed description thereof will be omitted.

Referring to FIG. 3B, an etching process is performed so that an upper portion of the upper electrode 36 protrudes. In FIG. 3B, a reference numeral "36A" represents the upper electrode, an upper portion of which protrudes by the etching process, and a reference numeral "35A" represents the etched resistive layer. In addition, a reference numeral "34A" represents the etched sacrificial layer.

For example, the etching process may be performed under a condition that an etch rate of the sacrificial layers 33 and 34A and the resistive layer 35A is higher than that of the upper electrode 36A. According to an example, the etching process may be performed by an anisotropic etching process (see arrows of FIG. 3B), Due to such an etching process, the sacrificial layers 33 and 34A and the resistive layer 35A are partially etched by a desired depth so that the upper portion of the upper electrode 36A protrudes. That is, while the upper electrode 36A and the resistive layer 35a are buried within the sacrificial layers 33 and 34A, the top surface of the upper electrode 36A protrudes over the top surfaces of the resistive layer 35A and the sacrificial layer 34A. In addition, the upper edge ① of the protruding upper electrode 36A is etched to be rounded as shown in FIG. 3B.

In this manner, the upper electrode 36A having a profile with a rounded upper edge is formed. Here, the resistive element including the lower electrode 32, the resistive layer 35A, and the upper electrode 36A is formed where a lower portion of the upper electrode 36A is narrower than an upper portion thereof and an upper edge of the upper electrode 36A has a rounded profile.

Referring to FIG. 3C, a selection element 37 is formed on a resulting structure in which the upper portion of the upper electrode 36A protrudes. A selection electrode 38 is formed on the selection element 37.

In accordance with the embodiment set forth above, after forming the protruding upper electrode 36A, the selection element 37 is formed on the protruding upper electrode 36A. Thus, the effective area of the selection element 37 for contact can be further increased. In addition, since the upper edge of the upper electrode 36A has a rounded profile, an electric field may be prevented from being concentrated on the edge of the upper electrode 36A. Therefore, an appropriate switching characteristic distribution of the resistive element may be obtained, and occurrence of a leakage current may be prevented/reduced at the edge of the resistive element. Furthermore, an appropriate on/off ratio (e.g., resistance ratio) of the selection element may be obtained.

In accordance with the embodiments of the present invention, since an upper electrode is formed to have a lower portion narrower than an upper portion thereof, the effective area of the resistive element is reduced and the effective area of the selection element is increased. The reduction in the effective area of the resistive element decreases an amount of a current required in a switching operation so that appropriate characteristics of the resistive memory device may be obtained. Furthermore, since the effective area of the selection element is increased, the resistance thereof is reduced, whereby an electric field and a current can be appropriately supplied to the resistive element during a switching operation.

While the present invention has been described with respect to the specific embodiments, it v rill be apparent to those skilled in the art that various changes and modifications may be made without departing from the spirit and scope of the invention as defined in the following claims.

What is claimed is:

1. A resistive memory device comprising:
a lower electrode formed over a substrate;
a sacrificial layer formed over the lower electrode;
a resistive layer buried in the sacrificial layer over the lower electrode; and
an upper electrode formed over the resistive layer,
wherein a top surface of the upper electrode protrudes higher than top surface of the resistive layer and the sacrificial layer, and
wherein the top surface of the upper electrode has a rounded profile.

2. The resistive memory device of claim 1, further comprising:
a selection element fanned on the upper electrode; and
a selection electrode formed on the selection element.

3. The resistive memory device of claim 1, wherein the upper electrode has a pillar shape in which a lower portion is narrower than an upper portion and the resistive layer surrounds a sidewall and the lower portion of the upper electrode.

4. The resistive memory device of claim 3, wherein the upper electrode has a stepped sidewall having a width that is narrower at a lower portion thereof.

5. The resistive memory device of claim 1, wherein a height of the top surface of the resistive layer is the same as a height of the top surface of the sacrificial layer.

6. The resistive memory device of claim 1, wherein the entire top surface of the upper electrode protrudes above the entire top surfaces of the resistive layer and the sacrificial layer.

7. The resistive memory device of claim 1, further comprising:
- a selection element over the upper electrode; and
- a selection electrode over the upper electrode, wherein the selection element and the selection electrode are configured to select the resistive memory device formed by the lower electrode, the resistive layer, and the upper electrode.

8. The resistive memory device of claim 7, wherein the selection of the resistive memory includes turning on a connection to the resistive memory.

9. The resistive memory device of claim 1, wherein the resistive layer comprises phase change materials or resistive variable materials.

10. A resistive memory device comprising:
- a lower electrode formed over a substrate;
- a resistive layer formed over the lower electrode; and
- an upper electrode formed over the resistive layer,
- wherein a lower portion of the upper electrode is narrower than an upper portion of the upper electrode, and a top surface of the upper electrode has a rounded profile.

* * * * *